US007391354B2

(12) United States Patent
Tsunakawa et al.

(10) Patent No.: US 7,391,354 B2
(45) Date of Patent: Jun. 24, 2008

(54) SEMICONDUCTOR INTEGRATED CIRCUIT

(75) Inventors: Hiroyuki Tsunakawa, Tokyo (JP); Akihiro Kitagawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/657,485

(22) Filed: Jan. 25, 2007

(65) Prior Publication Data
US 2007/0216558 A1    Sep. 20, 2007

(30) Foreign Application Priority Data
Mar. 14, 2006    (JP)    ............................. 2006-068758

(51) Int. Cl.
*H03M 1/12*    (2006.01)

(52) U.S. Cl. ......................... 341/172; 341/120; 341/155; 341/161; 341/163

(58) Field of Classification Search ................ 341/120, 341/155, 161, 163, 172
See application file for complete search history.

(56) References Cited

U.S. PATENT DOCUMENTS 5,675,340 A * 10/1997 Hester et al. ................ 341/156
6,144,331 A * 11/2000 Jiang ........................... 341/172
6,181,269 B1 * 1/2001 Nishiuchi et al. ........... 341/164
6,433,727 B1 * 8/2002 Yoshinaga ................... 341/172
6,731,232 B1 * 5/2004 Kearney ...................... 341/163
6,828,927 B1 * 12/2004 Hurrell et al. ............... 341/156
6,844,840 B1 * 1/2005 Melanson ................... 341/161
6,940,445 B2 * 9/2005 Kearney ...................... 341/163
7,046,178 B2 * 5/2006 Draxelmayr ................ 341/120
2006/0284750 A1 * 12/2006 Keskin ........................ 341/120

FOREIGN PATENT DOCUMENTS

JP    2004-260263 A    9/2004

* cited by examiner

*Primary Examiner*—Linh V Nguyen
(74) *Attorney, Agent, or Firm*—Miles & Stockbridge P.C.

(57) ABSTRACT

One input terminals of switches respectively coupled to capacitors of a capacitance array type D/A converter configured as a main DAC are coupled to a first external terminal of an IC. On the other hand, a current switching type D/A converter of a resistance string type D/A converter configured as a sub DAC that causes a DC current to flow therethrough is coupled to a second external terminal of the IC.

22 Claims, 5 Drawing Sheets

SEMICONDUCTOR INTEGRATED CIRCUIT

CROSS-REFERENCE TO RELATED APPLICATION

The present application claims priority from Japanese patent application No. 2006-68758 filed on Mar. 14, 2006, the content of which is hereby incorporated by reference into this application.

BACKGROUND OF THE INVENTION

The present invention relates to a semiconductor integrated circuit equipped with a successive approximation type A/D converter for converting an input analog signal to a digital signal, and particularly to a technique profitable when a high-accuracy analog reference voltage to be supplied to a local D/A converter contained in a successive approximation type A/D converter is supplied from outside a semiconductor integrated circuit.

As an A/D converter (analog-to-digital converter) for converting an input analog signal to a digital signal, there is now known a successive approximation type A/D converter which is product-versatile at low cost and with high performance.

In the successive approximation type A/D converter, a voltage comparator compares an input analog signal and each successive reference voltage. A controller of the successive approximation type A/D converter changes the corresponding successive reference voltage according to the result of its comparison. The voltage comparator performs a comparison with the input analog signal again. The controller executes a successive approximation that it changes each successive reference voltage. A local D/A converter is used for the changing of each successive reference voltage according to the result of comparison. The successive reference voltages are changed by the local D/A converter in response to control digital signals of plural bits from the result of comparison.

As described in a patent document 1 (Japanese Unexamined Patent Publication No. 2004-260263) as one for the local D/A converter, there has been a proposal in which a capacitance array type DAC is used for a main DAC for conversion on the MSB (Most Significant Bit) side of the local D/A converter whereas a resistance string type DAC is used for a sub DAC for conversion on the LSB (Least Significant Bit) side of the local D/A converter, thereby reducing a chip exclusively-possessed area of a semiconductor integrated circuit.

The capacitance array type DAC used as the main DAC of the local D/A converter comprises a plurality of capacitors and a plurality of changeover switches respectively coupled to one ends of the capacitors. The other ends of the capacitors are connected in common and each voltage for common connection is inputted to a voltage comparator as a successive reference voltage compared with an input analog signal. An analog reference voltage is commonly applied to one input terminals of the respective changeover switches, and a base voltage is commonly applied to the other input terminals of the respective changeover switches. The changeover switches are controlled by control digital signals on the MSB side. Incidentally, one capacitor is added to the capacitors of the capacitance array type DAC, and LSB-side successive reference voltages from the sub DAC to be described below are supplied to one end of the one additional capacitor.

The resistance string type DAC configured as the sub DAC in the local D/A converter comprises a plurality of resistances or resistors connected in series and a plurality of switches whose input terminals are respectively coupled to connecting nodes of the resistors. The switches are controlled by control digital signals on the LSB side. Incidentally, output terminals of the plural switches are connected in common so that the LSB-side successive reference voltages from the sub DAC are generated from the output terminals of the commonly-connected plural switches. One end and the other end of a series connection of the plural resistors of the resistance string type DAC are respectively supplied with their corresponding analog reference voltage and base voltage in a manner similar to the capacitance array type DAC configured as the main DAC.

SUMMARY OF THE INVENTION

Prior to the present invention, the present inventors et al. have discussed that an analog reference voltage supplied to both a capacitance array type DAC configured as a main DAC and a resistance string type DAC configured as a sub DAC, of a local D/A converter for a successive approximation type A/D converter is supplied from an external power supply located outside a semiconductor integrated circuit, and an operating voltage is supplied from the external power supply to a voltage comparator and a controller of the successive approximation type A/D converter.

Based on the result of above discussion, the present inventors et al. have evaluated a motherboard in which the semiconductor integrated circuit having built therein the successive approximation type A/D converter including the local D/A converter is incorporated.

However, the following problems were manifested by the result of evaluation. A plurality of changeover switches of the capacitance array type DAC corresponding to the main DAC of the local D/A converter are first controlled by control digital signals on the MSB side. Therefore, changeover noise based on the control digital signals leaks into the analog reference voltage applied to each of one input terminals of the respective changeover switches. There is a danger that the changeover noise based on the control digital signals, having leaked into the analog reference voltage of the capacitance array type DAC used as the main DAC further leaks into the resistance string type DAC used as the sub DAC. There is also a danger that the changeover noise leaks even into the voltage comparator and controller of the successive approximation type A/D converter.

In order to avoid such dangers, the analog reference voltage is supplied from the external power supply located outside the semiconductor integrated circuit to the main DAC and sub DAC of the local D/A converter via the input/output of a low-pass filter constituted of a resistor and a pair of capacitors connected across the resistor. If done in this way, then changeover noise having leaked out into the input of the low-pass filter can sufficiently be reduced even though the changeover noise based on the control digital signals has leaked into the analog reference voltage of the main DAC of the local D/A converter. As a result, the changeover noise that leaks into the resistance string type DAC used as the sub DAC and the voltage comparator and controller of the successive approximation type A/D converter can be sufficiently reduced.

It has however been revealed by investigations of the present inventors et al. that although the changeover noise having leaked into the resistance string type DAC used as the sub DAC and the comparator and controller of the successive approximation type A/D converter can be sufficiently reduced, the technique using the low-pass filter causes another new problem to be described below.

That is, a DC current flows through the resistors connected in series at the resistance string type DAC used as the sub DAC of the local D/A converter from the analog reference voltage. Thus, when the analog reference voltage is supplied to the main DAC and sub DAC of the local D/A converter through the above low-pass filter, a voltage drop based on the DC current of the resistance string type DAC of the sub DAC is developed across the resistor of the low-pass filter. The voltage drop developed across the resistor of the low-pass filter exerts a bad influence on the accuracy of the analog reference voltage supplied to the main DAC and sub DAC of the local D/A converter.

The patent document 1 describes that the analog reference voltage is supplied to the one input terminals of the changeover switches of the capacitance array type DAC used as to the main DAC of the local D/A converter, whereas the analog reference voltage is supplied to the resistance string type DAC used as the sub DAC of the local D/A converter via a voltage follower circuit. In the present method, however, a voltage further higher than the analog reference voltage supplied to the voltage follower circuit is needed as an operating power supply voltage.

Thus, the present invention has been made based on the above result of discussion by the present inventors et al. It is therefore an object of the present invention to avoid development of a DC voltage drop across a resistor of a low-pass filter due to a DC current of a resistance string type DAC used as a sub DAC of a local D/A converter even though an analog reference voltage is supplied to one input terminals of a plurality of changeover switches respectively coupled to a plurality of capacitors of a main DAC of the local D/A converter for a successive type A/D converter built in a semiconductor integrated circuit.

The above, other objects and novel features of the present invention will become apparent from the description of the present specification and the accompanying drawings.

Summaries of representative ones of the inventions disclosed in the present application will briefly be explained as follows:

A semiconductor integrated circuit according to one embodiment of the present invention comprises a successive approximation type A/D converter incorporated therein, including a local D/A converter. A main D/A converter and a sub D/A converter of the local D/A converter are respectively constituted of a capacitance array type D/A converter and a resistance string type D/A converter. The capacitance array type D/A converter used as the main D/A converter is constituted of a plurality of capacitors (C0, C1, ... and C254) and a plurality of changeover switches (CSW0, CSW1, ... and CSW254) respectively coupled to one ends of the capacitors (C0, C1, ... C254), and the other ends of the capacitors (C0, C1, ... and C254) are commonly coupled to a voltage comparator (Comp), to which each voltage (Vx) for common connection is inputted as a successive reference voltage compared with an input analog signal (Analog In). One input terminals of the individual changeover switches of the changeover switches (CSW0, CSW1, ... and CSW254) are commonly coupled to a first external terminal (T1) of the semiconductor integrated circuit in such a manner that the one input terminals of the respective changeover switches are capable of being commonly supplied with an analog reference voltage (AVrefhigh) via a low-pass filter (LPF1) from outside the semiconductor integrated circuit. One capacitor (C255) is added to the capacitors (C0, C1, ... and C254) of the capacitance array type D/A converter and one end of the one additional capacitor (C255) is supplied with each LSB-side successive reference voltage from the sub D/A converter to be described below. The resistance string type D/A converter used as the sub D/A converter of the local D/A converter comprises a plurality of resistors (R15, R14, ..., R1 and R0) connected in series, and a plurality of switches (RSW15, RSW14, ..., RSW01 and RSW00) having input terminals coupled to connecting nodes of the resistors (R15, R14, ..., R1 and R0). Output terminals of the switches (RSW15, RSW14, ..., RSW01 and RSW00) are connected in common thereby to generate the LSB-side successive reference voltages from the sub D/A converter out of the commonly-connected output terminals of the switches (RSW15, RSW14, ..., RSW01 and RSW00). One end of a series connection of the resistors (R15, R14, ..., R1 and R0) of the resistance string type D/A converter used as the sub D/A converter is coupled to a second external terminal (T2) of the semiconductor integrated circuit in such a manner that the one end of the series connection thereof is capable of being supplied with the analog reference voltage (AVcc) from outside the semiconductor integrated circuit (see FIG. 1).

According to means of the one embodiment of the present invention, the one end of the series connection of the resistors (R15, R14, ..., R1 and R0) of the resistance string type D/A converter used as the sub D/A converter is coupled to the second external terminal (T2) of the semiconductor integrated circuit. Therefore, even though the analog reference voltage (AVrefhigh) is commonly supplied via the low-pass filter (LPF1) to the one input terminals of the changeover switches (CSW0, CSW1, ... and CSW254) of the capacitance array type D/A converter used as the main D/A converter from outside the semiconductor integrated circuit, it is possible to avoid that a DC voltage drop due to a DC current of the resistance string type DAC used as the sub DAC of the local D/A converter is developed across a resistor (10Ω) of the low-pass filter (LPF1) (see FIG. 1).

In one specific embodiment of the present invention, the analog reference voltage (AVrefhigh) is supplied to the first external terminal (T1) of the semiconductor integrated circuit via the low-pass filter (LPF1) from outside the semiconductor integrated circuit, and the analog reference voltage (AVrefhigh) is supplied to the second external terminal (T2) of the semiconductor integrated circuit from outside the semiconductor integrated circuit.

A semiconductor integrated circuit according to another embodiment of the present invention also includes a successive approximation type A/D converter incorporated therein, including a local D/A converter. A main D/A converter and a sub D/A converter of the local D/A converter are respectively constituted of a capacitance array type D/A converter and a resistance string type D/A converter. The capacitance array type D/A converter used as the main D/A converter is constituted of a plurality of capacitors (C0, C1, ... and C254) and a plurality of changeover switches (CSW0, CSW1, ... and CSW254) respectively coupled to one ends of the capacitors (C0, C1, ... and C254). The other ends of the plural capacitors (C0, C1, ... and C254) are commonly coupled to a voltage comparator (Comp), to which each voltage (Vx) for common connection is inputted as a successive reference voltage compared with an input analog signal (Analog In). One input terminals of the plural changeover switches (CSw0, CSW1, ... and CSW254) are commonly coupled to a first external terminal (T1) of the semiconductor integrated circuit in such a manner that the one input terminals of the respective changeover switches are capable of being commonly supplied with an analog reference voltage (AVrefhigh) via a low-pass filter (LPF1) from outside the semiconductor integrated circuit. The capacitance array type D/A converter includes one capacitor (C255) added to the plural capacitors (C0, C1, ... and C254) and having one end supplied with each LSB-side successive reference voltage from the sub D/A converter to be described below. The resistance string type D/A converter used as the sub D/A converter of the local D/A converter comprises a plurality of resistors (R15, R14, ..., R1 and R0) connected in series, and a plurality of switches (RSW15, RSW14, ..., RSW01 and RSW00) having input terminals coupled to connecting nodes of the plural resistors (R15, R14, ..., R1 and R0). Output terminals of the plural switches (RSW15, RSW14, ..., RSW01 and RSW00) are connected in common thereby to generate the LSB-side successive reference voltages from the sub D/A converter out of the commonly-connected output terminals of the plural switches (RSW15, RSW14, ..., RSW01 and RSW00). A connecting destination for one end of a series connection of the plural resistors (R15, R14, ..., R1 and R0) of the resistance string type D/A converter used as the sub D/A converter is switched from the first external terminal (T1) to a second external terminal (T2) of the semiconductor integrated circuit in such a manner that the one end of the series connection thereof is capable of being supplied with the analog reference voltage (AVcc) from outside the semiconductor integrated circuit (see FIG. 2).

According to means of another embodiment of the present invention, the connecting destination for the one end of the series connection of the plural resistors (R15, R14, ..., R1 and R0) of the resistance string type D/A converter used as the sub D/A converter is switchable from the first external terminal (T1) to the second external terminal (T2). Therefore, even though the analog reference voltage (AVrefhigh) is commonly supplied via the low-pass filter (LPF1) to the one input terminals of the plural changeover switches (CSW0, CSW1, ... and CSW254) of the capacitance array type D/A converter used as the main D/A converter from outside the semiconductor integrated circuit, it is possible to avoid that a DC voltage drop due to a DC current of the resistance string type DAC used as the sub DAC of the local D/A converter is developed across a resistor (10Ω) of the low-pass filter (LPF1) (see FIG. 1).

In the semiconductor integrated circuit according to another embodiment of the present invention, the one end of the series connection of the plural resistors (R15, R14, ..., R1 and R0) of the resistance string type D/A converter used as the sub D/A converter is coupled to the first external terminal (T1) of the semiconductor integrated circuit via a drain-source current path of a first P channel MOS transistor (Mp1), the one end of the series connection of the plural resistors (R15, R14, ..., R1 and R0) of the resistance string type D/A converter used as the sub D/A converter is coupled to the second external terminal (T2) of the semiconductor integrated circuit via a drain-source current path of a second P channel MOS transistor (Mp2), and the first P channel MOS transistor (Mp1) is controlled to an off state and the second P channel MOS transistor (Mp2) is controlled to an on state to thereby switch the connecting destination for the one end of the series connection of the plural resistors (R15, R14, ..., R1 and R0) from the first external terminal (T1) to the second external terminal (T2) (see FIG. 2).

In the semiconductor integrated circuit according to another embodiment of the present invention, control programs for controlling the first P channel MOS transistor (Mp1) to an off state and controlling the second P channel MOS transistor (Mp2) to an on state are stored in a built-in memory (ROM, NV_Flash) (see FIG. 2).

A semiconductor integrated circuit according to a further embodiment of the present invention includes a successive approximation type A/D converter built therein, including a local D/A converter. A main D/A converter and a sub D/A converter of the local D/A converter are respectively constituted of a capacitance array type D/A converter and a current switching type D/A converter. The capacitance array type D/A converter used as the main D/A converter is constituted of a plurality of capacitors (C0, C1, ... and C254) and a plurality of changeover switches (CSW0, CSW1, ... and CSW254) respectively coupled to one ends of the plural capacitors (C0, C1, ... and C254). The other ends of the plural capacitors (C0, C1, ... and C254) are commonly coupled to a voltage comparator (Comp), to which each voltage (Vx) for common connection is inputted as a successive reference voltage compared with an input analog signal. One input terminals of the individual changeover switches of the plural changeover switches (CSW0, CSW1, ... and CSW254) are commonly coupled to a first external terminal (T1) of the semiconductor integrated circuit in such a manner that the one input terminals of the respective changeover switches thereof are capable of being commonly supplied with an analog reference voltage (AVrefhigh) via a low-pass filter (LPF1) from outside the semiconductor integrated circuit. One capacitor (C255) is added to the plural capacitors (C0, C1, ... and C254) of the capacitance array type D/A converter and one end of the one additional capacitor (C255) is supplied with each LSB-side successive reference voltage from the sub D/A converter to be described below. The current switching type D/A converter used as the sub D/A converter of the local D/A converter comprises a plurality of constant current sources (I0, 2I0, ... and 16I0) weighted at a predetermined ratio, and a plurality of differential pair transistors (Qp1, Qp2; Qp3, Qp4; ... ; Qp5 and Qp6) respectively coupled to the plural constant current sources (I0, 2I0, ... 16I0). Output terminals of the plural one transistors (Qp1; Qp3; ... ; Qp5) of the plural differential pair transistors are connected in common thereby to generate the LSB-side successive reference voltages from the sub D/A converter out of the commonly connected output terminals of the plural one transistors (Qp1; Qp3; ... ; Qp5). The plural constant current sources (I0, 2I0, ... and 16I0) of the current switching type D/A converter used as the sub D/A converter are coupled to a second external terminal (T2) of the semiconductor integrated circuit in such a manner that the plural constant current sources (I0, 2I0, ... and 16I0) of the current switching type D/A converter used as the sub D/A converter are capable of being supplied with the analog reference voltage (AVcc) from outside the semiconductor integrated circuit (see FIG. 3).

According to means of the further embodiment of the present invention, the plural constant current sources (I0, 2I0, ... and 16I0) of the current switching type D/A converter used as the sub D/A converter are coupled to the second external terminal (T2) of the semiconductor integrated circuit. Therefore, even though the analog reference voltage (AVrefhigh) is commonly supplied via the low-pass filter (LPF1) from the outside of the semiconductor integrated circuit to the one input terminals of the individual changeover switches of the plural changeover switches (CSW0, CSW1, ... and CSW254) of the capacitance array type D/A converter used as the main D/A converter, it is possible to avoid that a DC voltage drop due to a DC current of the current switching type D/A converter used as the sub D/A converter of the local D/A converter is developed across a resistor (10Ω) of the low-pass filter (LPF1) (see FIG. 3).

In the further embodiment of the present invention, the analog reference voltage (AVrefhigh) is supplied to the first external terminal (T1) of the semiconductor integrated circuit via the low-pass filter (LPF1) from outside the semiconductor integrated circuit, and the analog reference voltage (AVrefhigh) is supplied to the second external terminal (T2) of the semiconductor integrated circuit from outside the semiconductor integrated circuit.

A semiconductor integrated circuit according to a still further embodiment of the present invention includes a successive approximation type A/D converter built therein, including a local D/A converter. A main D/A converter and a sub D/A converter of the local D/A converter are respectively constituted of a capacitance array type D/A converter and a current switching type D/A converter. The capacitance array type D/A converter used as the main D/A converter is constituted of a plurality of capacitors (C0, C1, ... and C254) and a plurality of changeover switches (CSW0, CSW1, ... and CSW254) respectively coupled to one ends of the plural capacitors (C0, C1, ... and C254). The other ends of the plural capacitors (C0, C1, ... and C254) are commonly coupled to a voltage comparator (Comp), to which each voltage (Vx) for common connection is inputted as a successive reference voltage compared with an input analog signal. One input terminals of the individual changeover switches of the plural changeover switches (CSW0, CSW1, ... and CSW254) are commonly coupled to a first external terminal (T1) of the semiconductor integrated circuit in such a manner that the one input terminals of the respective changeover switches are capable of being commonly supplied with an analog reference voltage (AVrefhigh) via a low-pass filter (LPF1) from outside the semiconductor integrated circuit. One capacitor (C255) is added to the plural capacitors (C0, C1, ... and C254) of the capacitance array type D/A converter, and one end of the one additional capacitor (C255) is supplied with each LSB-side successive reference voltage from the sub D/A converter to be described below. The current switching type D/A converter used as the sub D/A converter of the local D/A converter comprises a plurality of constant current sources (I0, 2I0, ... and 16I0) weighted at a predetermined ratio, and a plurality of differential pair transistors (Qp1, Qp2; Qp3, Qp4; ... ; Qp5 and Qp6) respectively coupled to the plural constant current sources (I0, 2I0, ... and 16I0). Output terminals of the plural one transistors (Qp1; Qp3; ... ; Qp5) of the plural differential pair transistors are connected in common thereby to generate the LSB-side successive reference voltages from the sub D/A converter out of the commonly-connected output terminals of the plural one transistors (Qp1; Qp3; ... ; Qp5). Connecting destinations for the plural constant current sources (I0, 2I0, ... and 16I0) of the current switching type D/A converter used as the sub D/A converter are switchable from the first external terminal (T1) to a second external terminal (T2) of the semiconductor integrated circuit in such a manner that the plural constant current sources (I0, 2I0, ... and 16I0) of the current switching type D/A converter used as the sub D/A converter are capable of being supplied with the analog reference voltage (AVcc) from outside the semiconductor integrated circuit (see FIG. 4).

According to means of the still further embodiment of the present invention, the connecting destinations for the plural constant current sources (I0, 2I0, ... and 16I0) of the current switching type D/A converter used as the sub D/A converter are switchable from the first external terminal (T1) to the second external terminal (T2). Therefore, even though the analog reference voltage (AVrefhigh) is commonly supplied via the low-pass filter (LPF1) from the outside of the semiconductor integrated circuit to the one input terminals of the individual changeover switches of the plural changeover switches (CSW0, CSW1, ... and CSW254) of the capacitance array type D/A converter used as the main D/A converter, it is possible to avoid that a DC voltage drop due to a DC current of the current switching type D/A converter used as the sub D/A converter of the local D/A converter is developed across a resistor (10Ω) of the low-pass filter (LPF1) (see FIG. 4).

In the still further embodiment of the present invention, the analog reference voltage (AVrefhigh) is supplied to the first external terminal (T1) of the semiconductor integrated circuit via the low-pass filter (LPF1) from outside the semiconductor integrated circuit, and the analog reference voltage (AVrefhigh) is supplied to the second external terminal (T2) of the semiconductor integrated circuit from outside the semiconductor integrated circuit.

An advantageous effect obtained by a representative one of the inventions disclosed in the present application will briefly be explained as follows:

According to the present invention, although one input terminals of a plurality of changeover switches respectively coupled to a plurality of capacitors of a main DAC of a local D/A converter for a successive type A/D converter built in a semiconductor integrated circuit are supplied with a high-level reference voltage via the input/output of a low-pass filter from outside the semiconductor integrated circuit, it is possible to avoid that a DC voltage drop due to a DC current of a resistance string type DAC use as a sub DAC of the local D/A converter is developed across a resistor of the low-pass filter.

DETAILED DESCRIPTION OF THE PREFERRED EMBODIMENTS

<<Configuration of Semiconductor Integrated Circuit Including Successive Approximation Type A/D Converter>>

Figure 1:
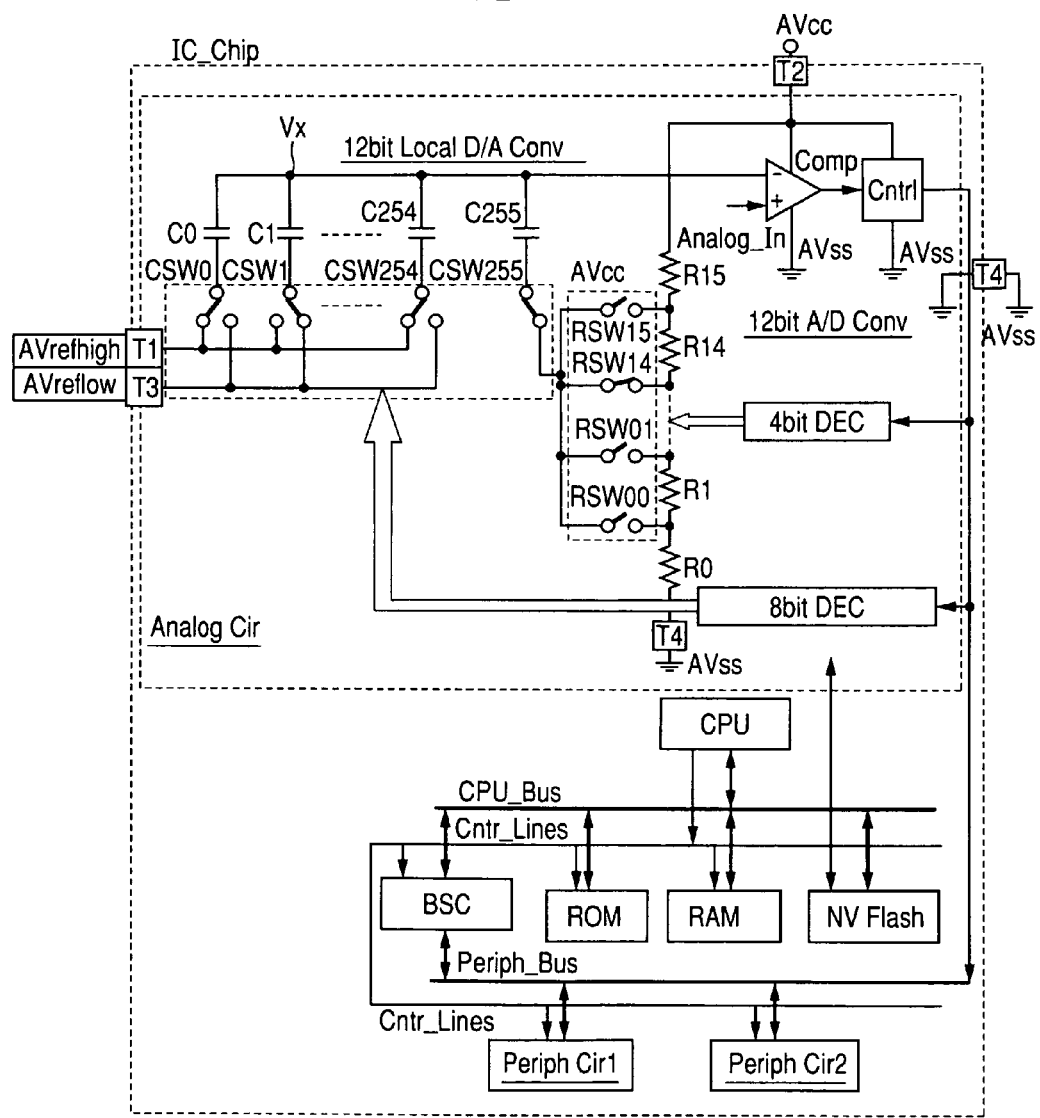
FIG. 1 is a diagram showing a configuration of a semiconductor integrated circuit including a successive approximation type A/D converter on a chip, according to one embodiment of the present invention.
Figure 1:
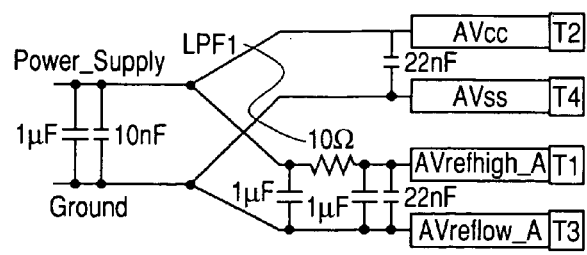

FIG. 1 is a diagram showing a configuration of a semiconductor integrated circuit including a successive approximation type A/D converter on a chip, according to one embodiment of the present invention.

As shown in the same figure, a 12-bit successive approximation type A/D converter 12 bit A/D_Conv of an analog circuit block Analog Cir of a chip IC Chip for the semiconductor integrated circuit comprises a 12-bit local D/A converter 12 bit Local D/A_Conv, a voltage comparator Comp and a controller Cntrl. The chip IC Chip for the semiconductor integrated circuit includes a central processing unit CPU. A read only memory ROM, a random access memory RAM, a flash nonvolatile memory NV_Flash, a bus switch controller BSC and peripheral circuits Periph Cirl and Periph Cir2 are coupled to the central processing unit CPU via a CPU bus CPU Bus, control lines Cntr_Lines and a peripheral bus Periph Bus.

An input analog signal is converted to a digital signal by the 12-bit successive approximation type A/D converter 12 bit A/D_Conv of the analog circuit block Analog Cir. The converted 12-bit digital signal can be processed by the central processing unit CPU via the peripheral bus Periph Bus, the bus switch controller BSC and the CPU bus CPU Bus.

A main D/A converter and a sub D/A converter of the 12-bit local D/A converter 12 bit Local D/A_Conv contained in the 12-bit successive approximation type A/D converter 12 bit A/D_Conv are respectively constituted of a capacitance array type D/A converter and a resistance string type D/A converter. The capacitance array type D/A converter configured as the main D/A converter comprises 255 capacitances or capacitors C0, C1, . . . and C254 equal in capacitance value to one another and 255 changeover switches CSW0, CSW1, . . . and CSW254 respectively coupled to one ends of the 255 capacitors C0, C1, . . . and C254. The other ends of the 255 capacitors C0, C1, . . . and C254 are connected in common. A common connecting voltage Vx is inputted to the voltage comparator Comp as a successive reference voltage compared with an input analog signal Analog In. One input terminals of the individual changeover switches corresponding to the 255 changeover switches CSW0, CSW1, . . . and CSW254 are commonly coupled to a first external terminal T1 of the semiconductor integrated circuit in such a manner that the one input terminals of the respective changeover switches corresponding to the 255 changeover switches CSW0, CSW1, . . . and CSW254 can be supplied with an analog reference voltage AVrefhigh in common via a low-pass filter LPF1 from outside the semiconductor integrated circuit. The other input terminals of the respective changeover switches corresponding to the 255 changeover switches CSW0, CSW1, . . . and CSW254 are commonly coupled to a third external terminal T3 of the semiconductor integrated circuit in such a manner that the other input terminals of the respective changeover switches corresponding to the 255 changeover switches CSW0, CSW1, . . . and CSW254 can be supplied with a base voltage AVreflow in common from outside the semiconductor integrated circuit. The 255 changeover switches CSW0, CSW1, . . . and CSW254 are controlled by an 8-bit input decoder 8 bit_DEC coupled to the output of the controller Cntr1. One capacitance or capacitor C255 is added to the 255 capacitors C0, C1, . . . and C254 of the capacitance array type D/A converter. LSB-side successive reference voltages from the sub D/A converter to be described below are supplied to one end of the one additional capacitor 255. The resistance string type D/A converter configured as the sub D/A converter in the local D/A converter comprises 16 resistances or resistors R15, R14, . . . , R1 and R0 connected in series and 16 switches RSW15, RSW14, . . . , RSW01 and RSW00 whose input terminals are respectively coupled to connecting nodes of the 16 resistors R15, R14, . . . , R1 and R0. Output terminals of the 16 switches RSW15, RSW14, . . . , RSW01 and RSW00 are connected in common so that the LSB-side successive reference voltages from the sub D/A converter are generated from the output terminals of the commonly-connected 16 switches RSW15, RSW14, . . . , RSW01 and RSW00. One end of a series connection of the 16 resistors R15, R14, . . . , R1 and R0 is coupled to a second external terminal T2 of the semiconductor integrated circuit in such a manner that an analog reference voltage AVc can be supplied from the outside of the semiconductor integrated circuit to the one end of the series connection of the 16 resistors R15, R14, . . . , R1 and R0 of the resistance string type D/A converter configured as the sub D/A converter. The other end of the series connection of the 16 resistors R15, R14, . . . , R1 and R0 are coupled to a fourth external terminal T4 of the semiconductor integrated circuit in such a manner that the other end of the series connection of the 16 resistors R15, R14, . . . , R1 and R0 of the resistance string type D/A converter configured as the sub D/A converter can be supplied with a base voltage AVss from outside the semiconductor integrated circuit. The 16 switches RSW15, RSW14, . . . , RSW01 and RSW00 are controlled by a 4-bit input decoder 4 bit_DEC coupled to the output of the controller Cntrl.

Incidentally, as shown below FIG. 1, an analog reference voltage AVrefhigh is supplied via a low-pass filter LPF1 from the outside of the semiconductor integrated circuit to the first input terminal T1 of the semiconductor integrated circuit, which is commonly coupled to the one input terminals of the 255 changeover switches CSW0, CSW1, . . . and CSW254 of the 12-bit local D/A converter 12 bit Local D/A_Conv. The low-pass filter LPF1 comprises a resistor of 10Ω, a capacitor of 1 μF and parallel capacitors of 1 μF and 22 nF, which are coupled to both ends of the resistor of 10Ω. A base voltage AVreflow is supplied from the outside of the semiconductor integrated circuit to the third external terminal T3 of the semiconductor integrated circuit commonly coupled to the other input terminals of the 255 changeover switches CSW0, CSW1, . . . and CSW254 of the main D/A converter of the 12-bit local D/A converter 12 bit Local D/A_Conv. An analog reference voltage AVcc is supplied from the outside of the semiconductor integrated circuit to the second external terminal T2 of the semiconductor integrated circuit, which is coupled to the one end of the series connection of the 16 resistors R15, R14, . . . , R1 and R0 of the resistance string type D/A converter configured as the sub D/A converter, the voltage comparator Comp and the controller Cntrl. A base voltage AVss is supplied from the outside of the semiconductor integrated circuit to the fourth external terminal T4 of the semiconductor integrated circuit, which is coupled to the other end of the series connection of the 16 resistors R15, R14, . . . , R1 and R0 of the resistance string type D/A converter configured as the sub D/A converter, the voltage comparator Comp and the controller Cntrl. As also shown below FIG. 1, a unified power supply voltage is supplied from parallel capacitors of 1 μF and 10 nF, so that a plurality of operating source or power supply voltage AVREFhighA and AVcc supplied to the first and second external terminals of the semiconductor integrated circuit are generated from the unified power supply voltage.

Thus, according to the embodiment shown in FIG. 1, the one end of the series connection of the plural resistors R15, R14, . . . , R1 and R0 of the resistance string type D/A converter configured as the sub D/A converter, the voltage comparator Comp and the controller Cntrl are coupled to the second external terminal T2 of the semiconductor integrated circuit. Therefore, even though the analog reference voltage AVrefhigh is commonly supplied via the low-pass filter LPF1 from the outside of the semiconductor integrated circuit to the first external terminal T1 of the semiconductor integrated circuit, which is commonly coupled to the one input terminals of the plural changeover switches CSW0, CSW1, . . . and CSW254 of the capacitance array type D/A converter configured as the main D/A converter, a DC voltage drop developed due to a DC current across the series connection of the 16 resistors R15, R14, . . . , R1 and R0 of the resistance string type DAC configured as a sub DAC of the local D/A converter, a DC voltage drop developed due to the DC current of the voltage comparator Comp, and a DC voltage drop developed due to the DC current of the controller Cntrl can be avoided from occurring due to the resistor of 10Ω of the low-pass filter LPF1.

Figure 5:
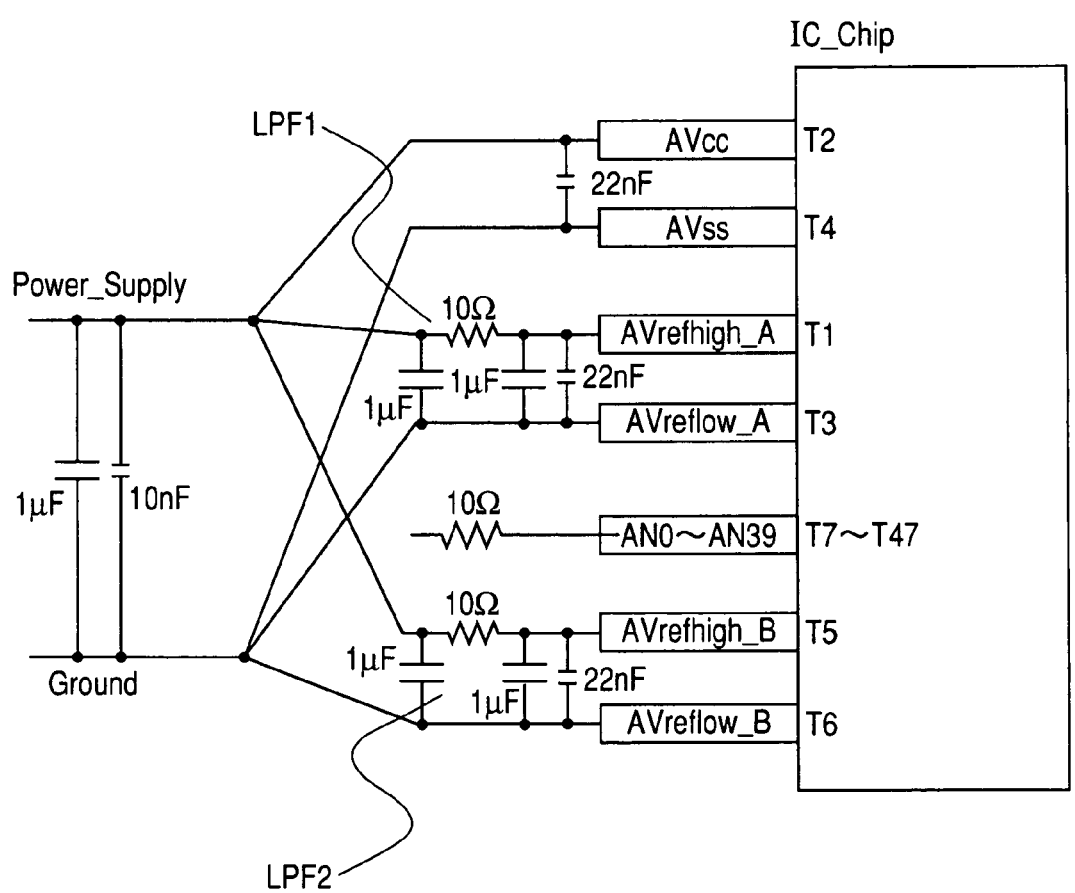
FIG. 5 is a circuit diagram showing a motherboard in which the semiconductor integrated circuit according to the one embodiment of the present invention shown in FIG. 1 is incorporated.

FIG. 5 is a circuit diagram showing a motherboard in which the semiconductor integrated circuit according to the one embodiment of the present invention shown in FIG. 1 is incorporated. The first external terminal T1 of the semiconductor integrated circuit, which is commonly coupled to the one input terminals of the 255 changeover switches CSW0, CSW1, . . . and CSW254 of the 12-bit local D/A converter 12 bit Local D/A_Conv, is supplied with an analog reference voltage AVrefhigh via its corresponding low-pass filter LPF1 from outside the semiconductor integrated circuit. The low-pass filter LPF1 comprises a resistor of 10Ω, a capacitor of 1 µF and parallel capacitors of 1 µF and 22 nF, which are provided across the resistor of 10Ω. A base voltage AVreflow is supplied from the outside of the semiconductor integrated circuit to the third external terminal T3 of the semiconductor integrated circuit commonly coupled to the other input terminals of the 255 changeover switches CSW0, CSW1, . . . and CSW254 of the main D/A converter of the 12-bit local D/A converter 12 bit Local D/A_Conv. An analog reference voltage AVcc is supplied from the outside of the semiconductor integrated circuit to the second external terminal T2 of the semiconductor integrated circuit, which is coupled to the one end of the series connection of the 16 resistors R15, R14, . . . , R1 and R0 of the resistance string type D/A converter configured as the sub D/A converter. A base voltage AVss is supplied from the outside of the semiconductor integrated circuit to the fourth external terminal T4 of the semiconductor integrated circuit, which is coupled to the other end of the series connection of the 16 resistors R15, R14, R1 and R0 of the resistance string type D/A converter configured as the sub D/A converter. Incidentally, in FIG. 5, an analog reference voltage AVrefhigh_B is supplied from the outside of the semiconductor integrated circuit to a fifth external terminal T5 of the semiconductor integrated circuit via a low-pass filter LPF2. A base voltage AVreflow_B is supplied from the outside of the semiconductor integrated circuit to a sixth external terminal T6 of the semiconductor integrated circuit. A 12-bit successive approximation type A/D converter of another channel is coupled to the fifth external terminal T5 and the sixth external terminal T6 of the semiconductor integrated circuit. Analog sense voltages from various sensors each having an impedance of 10 KΩ are supplied to seventh to forty seventh external terminals 7 through 47 of the semiconductor integrated circuit and supplied to the corresponding analog input terminal Analog_In of the voltage comparator Comp of the 12-bit successive approximation type A/D converter 12 bit A/A_Conv, followed by being A/D converted. Further, the unified power supply voltage of the motherboard is supplied from the parallel capacitors of 1 µF and 10 nF, so that a plurality of operating power supply voltages are generated from the unified power supply voltage.

Incidentally, in the one embodiment of the present invention shown in FIG. 1, the successive approximation type A/D converter is operated as follows: The capacitance-array type D/A converter configured as the main D/A converter of the 12-bit local D/A converter 12 bit Local D/A_Conv supplies the analog reference voltage AVrefhigh of the first external terminal T1 to the 128 changeover switches CSW0, CSW1, . . . and CSW127 of the 256 changeover switches CSW0, CSW1, . . . and CSW254 and CSW255, corresponding to 50% of its input dynamic range and supplies the analog reference voltage AVreflow of the third external terminal T3 to the changeover switches CSW128, . . . and CSW254 and CSW255 other than those. An analog reference voltage Vx and an input analog signal Analog In at this time are compared with each other by the voltage comparator Comp. When the voltage comparator Comp determines that the input analog signal Analog In is higher than the analog referenced voltage Vx, the 8-bit input decoder 8 bit_DEC coupled to the output of the controller Cntrl is operated in such a manner that the analog reference voltage AVrefhigh of the first external terminal T1 is supplied to the 192 changeover switches CSW0, CSW1, . . . and CSW191 of the 256 changeover switches CSW0, CSW1, . . . and CSW254 and CSW255, corresponding to 75% of the input dynamic range of the capacitance array type D/A converter configured as the main D/A converter of the 12-bit local D/A converter 12 bit Local D/A_Conv, and the analog reference voltage AVreflow of the third external terminal T3 is supplied to the changeover switches CSW192, . . . and CSW254 and CSW255 other than above. When the voltage comparator Comp determines that the analog signal Analog In is lower than the successive reference voltage Vx, the 8-bit input decoder 8 bit_DEC coupled to the output of the controller Cntrl is operated in such a manner that the analog reference voltage AVrefhigh of the first external terminal T1 is supplied to the 64 changeover switches CSW0, CSW1, . . . and CSW63 of the 256 changeover switches CSW0, CSW1, . . . and CSW254 and CSW255, corresponding to 25% of the input dynamic range of the capacitive array type D/A converter configured as the main D/A converter of the 12-bit local D/A converter 12 bit Local D/A_Conv, and the analog reference voltage AVreflow of the third external terminal T3 is supplied to the changeover switches CSW64, . . . and CSW254 and CSW255 other than above.

In the successive approximation type A/D converter as described above, the voltage comparator perform a comparison between the input analog signal and the successive reference voltage. Then, the controller of the successive approximation type A/D converter changes the successive reference voltage according to the result of its comparison. The voltage comparator performs a comparison with the input analog signal again, and the controller executes a successive approximation that the successive reference voltage is changed again. The local D/A converter is used for the changing of the successive reference voltage based on the result of comparison. With the successive approximation and the successive changing of successive reference voltage, the control digital signals of plural bits are caused to converge in response to the level of the input analog signal, and the successive approximation type A/D conversion is executed.

Figure 2:
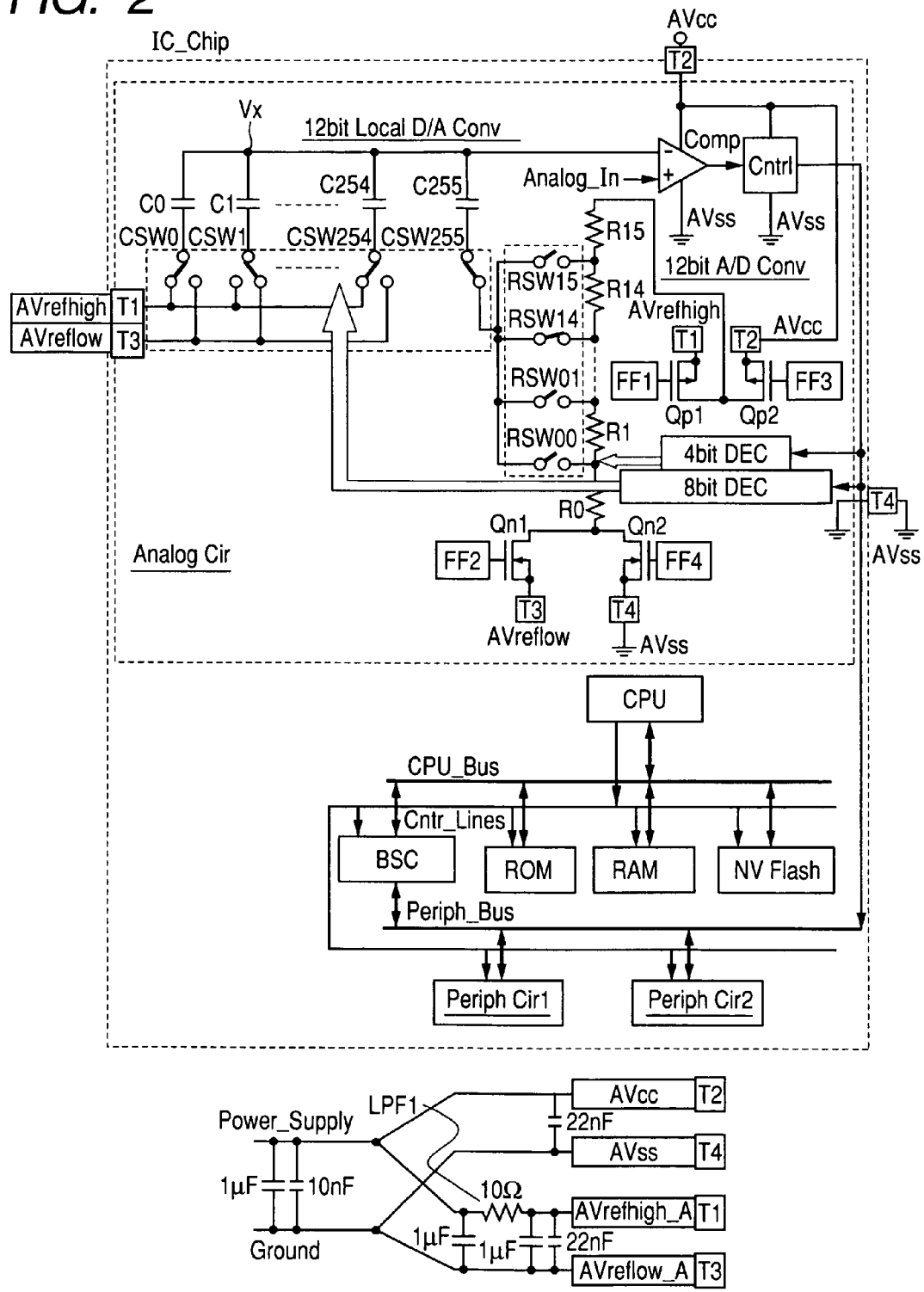
FIG. 2 is a diagram illustrating a configuration of a semiconductor integrated circuit including a successive approximation type A/D converter on a chip, according to another embodiment of the present invention.

FIG. 2 is a diagram showing a configuration of a semiconductor integrated circuit including a successive approximation type A/D converter on a chip, according to another embodiment of the present invention.

The embodiment shown in the same figure is different from the embodiment shown in FIG. 1 as follows: In FIG. 2, one end of a series connection of a plurality of resistors R15, R14, . . . , R1 and R0 of a resistance string type D/A converter configured as a sub D/A converter is coupled to a first external terminal T1 of the semiconductor integrated circuit via a drain-source current path of a first P channel MOS transistor Qp1 and coupled to a second external terminal T2 of the semiconductor integrated circuit via a drain-source current path of a second P channel MOS transistor Qp2. The other end of the series connection of the plural resistors R15, R14, . . . , R1 and R0 of the resistance string type D/A converter configured as the sub D/A converter is coupled to a third external terminal T3 of the semiconductor integrated circuit via a drain-source current path of a first N MOS transistor Qn1 and coupled to a fourth external terminal T4 of the semiconductor integrated circuit via a drain-source current path of a second N channel MOS transistor Qn2. The gate of the first P channel MOS transistor Qp1 is controlled by an output of a flip-flop FF1, and the gate of the second P channel MOS transistor Qp2 is controlled by an output of a flip-flop FF3. The gate of the first N channel MOS transistor Qn1 is controlled by an output of a flip-flop FF2, and the gate of the second N channel MOS transistor Qn2 is controlled by an output of a flip-flop FF4.

The turning on/off of the first P channel MOS transistor Qp1, second P channel MOS transistor Qp2, first N channel MOS transistor Qn1 and second N channel MOS transistor Qn2 is controlled according to the contents held in these flip-flops FF1 through FF4 respectively. The contents held in the flip-flops FF1 through FF4 can be set by control programs to be executed by a central processing unit CPU. According to the control programs by the central processing unit CPU, the first P channel MOS transistor Qp1 is controlled to an off state, the second P channel MOS transistor Qp2 is controlled to an on state, the first N channel MOS transistor Qn1 is controlled to an off state, and the second N channel MOS transistor Qn2 is controlled to an on state, thereby making it possible to realize the circuit of the motherboard shown in FIG. 5. Incidentally, the control programs for executing the on/off-control of the first P channel MOS transistor Qp1, second P channel MOS transistor Qp2, first N channel MOS transistor Qn1 and second N channel MOS transistor Qn2 are stored in a read-only memory ROM or a flash nonvolatile memory NV_Flash coupled to a CPU bus CPU_Bus.

Figure 3:
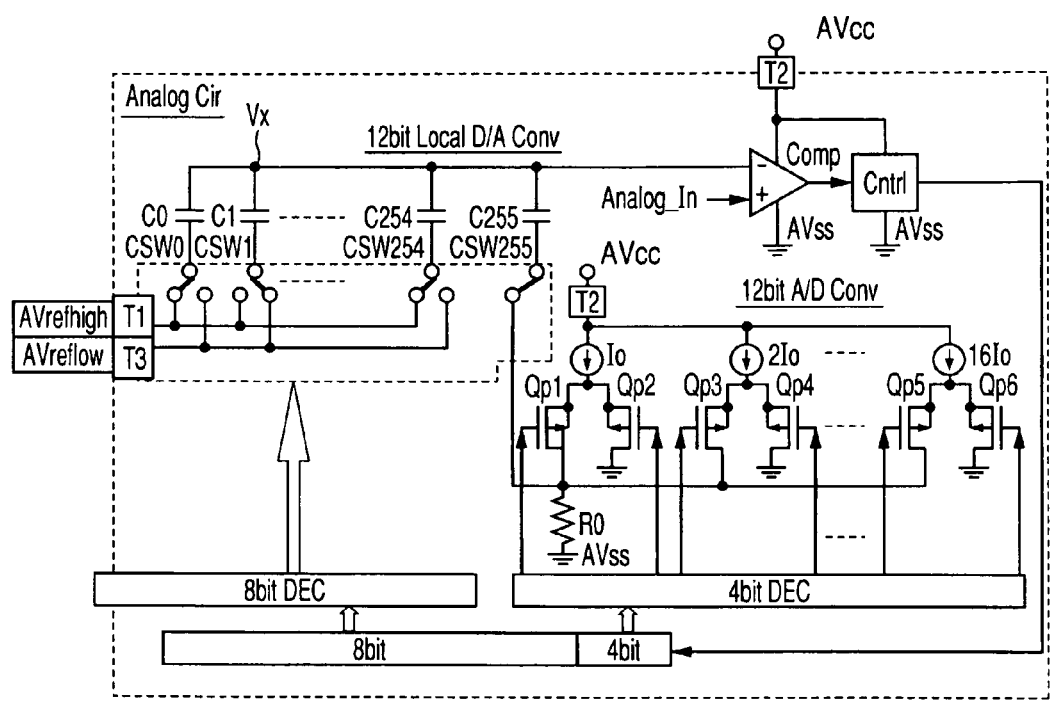
FIG. 3 is a diagram depicting a configuration of a semiconductor integrated circuit including a successive approximation type A/D converter on a chip, according to a further embodiment of the present invention.
Figure 3:
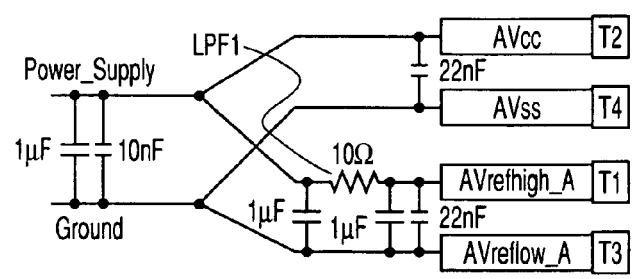

FIG. 3 is a diagram depicting a configuration of a semiconductor integrated circuit including a successive approximation type A/D converter on a chip, according to a further embodiment of the present invention.

The embodiment shown in the same figure is different from the embodiment shown in FIG. 1 as follows: In FIG. 3, a main D/A converter of a local D/A converter is constituted of a capacitance array type D/A converter. A sub D/A converter of the local D/A converter is a current switching type D/A converter without using a resistance string type D/A converter. The current switching type D/A converter comprises constant current sources Io, 2Io, . . . , 16Io whose current values are weighted in a ratio of 1: 2:3:4:5:6:7:8:9:10:11:12, and differential P channel MOS transistors Qp1, Qp2, Qp3, Qp4, Qp5 and Qp6. The current, switching type D/A converter also has the risk of causing a voltage drop across a resistor of a low-pass filter LPF1 located outside the semiconductor integrated circuit in a manner similar to the resistance string type D/A converters shown in FIGS. 1 and 2. Thus, the current sources Io, 2Io, . . . , and 16Io of the current switching type D/A converter are also coupled to a second external terminal T2 of the semiconductor integrated circuit.

Figure 4:
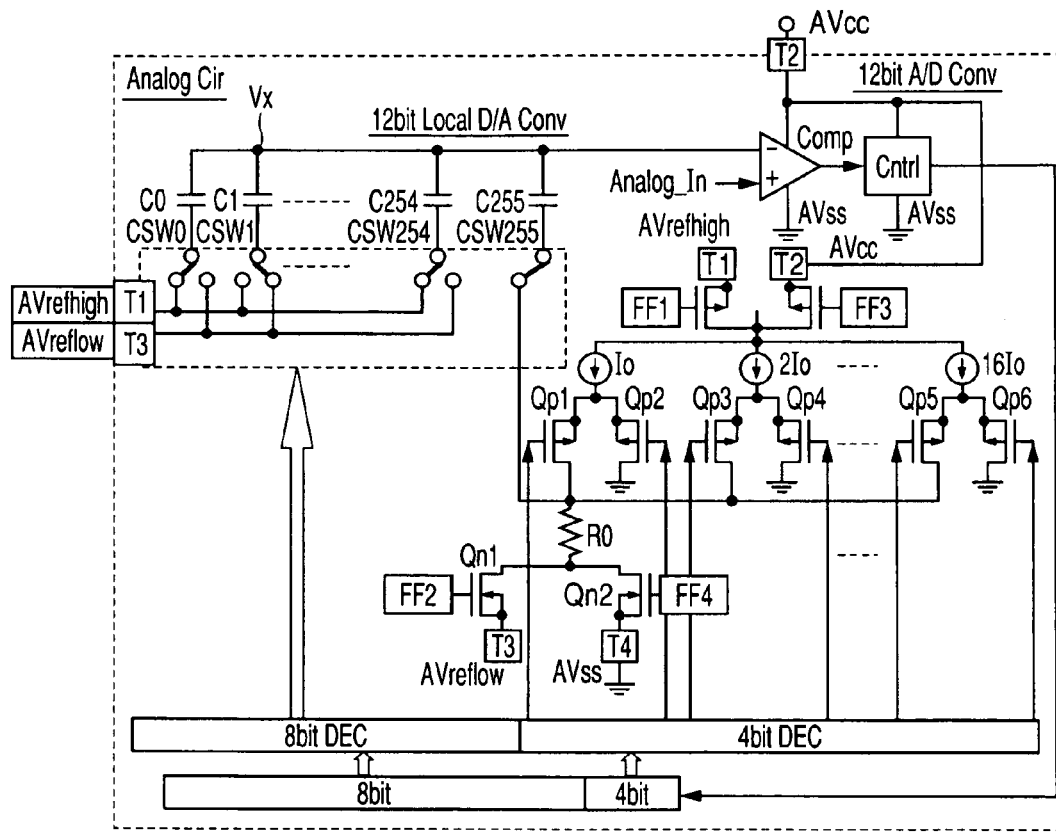
FIG. 4 is a diagram showing a configuration of a semiconductor integrated circuit including a successive approximation type A/D converter on a chip, according to a still further embodiment of the present invention.
Figure 4:
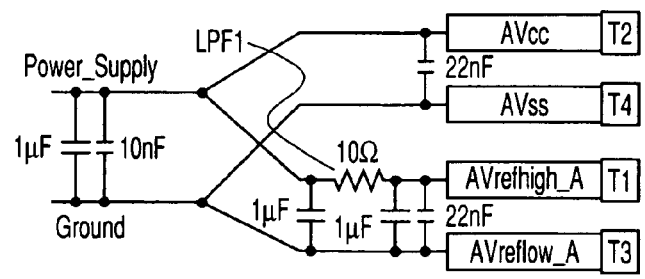

FIG. 4 is a diagram showing a configuration of a semiconductor integrated circuit including a successive approximation type A/D converter on a chip, according to a still further embodiment of the present invention.

The embodiment shown in the same figure is different from the embodiment shown in FIG. 3 in that constant current sources Io, 2Io, . . . , 16Io of a current switching type D/A converter are coupled to a first external terminal T1 of a semiconductor integrated circuit via a drain-source current path of a first P channel MOS transistor Qp1 and coupled to a second external terminal T2 of a semiconductor integrated circuit via a drain-source current path of a second P channel MOS transistor Qp2. A resistor R0 of the current switching type D/A converter is coupled to a third external terminal T3 of the semiconductor integrated circuit via a drain-source current path of a first N channel MOS transistor Qn1 and coupled to a fourth external terminal T4 of the semiconductor integrated circuit via a drain-source current path of a second N channel MOS transistor Qn2. The gate of the first P channel MOS transistor Qp1 is controlled by an output of a flip-flop FF1, the gate of the second P channel MOS transistor Qp2 is controlled by an output of a flip-flop FF3, the gate of the first N channel MOS transistor Qn1 is controlled by an output of a flip-flop FF2, and the gate of the second N channel MOS transistor Qn2 is controlled by an output of a flip-flop FF4, respectively.

The turning on/off of the first P channel MOS transistor Qp1, second P channel MOS transistor Qp2, first N channel MOS transistor Qn1 and second N channel MOS transistor Qn2 is controlled according to the contents held in these flip-flops FF1 through FF4 respectively. The contents held in the flip-flops FF1 through FF4 can be set by control programs to be executed by a central processing unit CPU. According to the control programs by the central processing unit CPU, the first P channel MOS transistor Qp1 is controlled to an off state, the second P channel MOS transistor Qp2 is controlled to an on state, the first N channel MOS transistor Qn1 is controlled to an off state, and the second N channel MOS transistor Qn2 is controlled to an on state, thereby making it possible to realize the circuit of the motherboard shown in FIG. 5. Incidentally, the control programs for executing the on/off-control of the first P channel MOS transistor Qp1, second P channel MOS transistor Qp2, first N channel MOS transistor Qn1 and second N channel MOS transistor Qn2 are stored in a read-only memory ROM or a flash nonvolatile memory NV_Flash coupled to a CPU bus CPU_Bus.

While the invention made above by the present inventors has been described specifically on the basis of the preferred embodiments, the present invention is not limited to the embodiments referred to above. It is needless to say that various changes can be made thereto without the scope not departing from the gist thereof.

It is needless to say that the present invention can be applied to, for example, an overall or general LSI equipped with a successive approximation type A/D converter including a controller operated by a control program and a local A/D converter constituted of a capacitance array type main DAC and a sub DAC for causing a DC current to flow therethrough as in the case of a system LSI, a digital analog mixed signal LSI and the like used in various applications even other than a microcontroller and a microprocessor each including a CPU.

What is claimed is:
1. A semiconductor integrated circuit comprising:
a successive approximation type A/D converter incorporated therein, including a local D/A converter,
wherein a main D/A converter and a sub D/A converter of the local D/A converter are respectively constituted of a capacitance array type D/A converter and a resistance string type D/A converter,
wherein the capacitance array type D/A converter used as the main D/A converter is constituted of a plurality of capacitors and a plurality of changeover switches respectively coupled to one ends of the capacitors, and the other ends of the capacitors are commonly coupled to a voltage comparator inputted with each voltage for common connection as a successive reference voltage compared with an input analog signal,
wherein one input terminals of the changeover switches are commonly coupled to a first external terminal of the semiconductor integrated circuit in such a manner that the one input terminals of the respective changeover switches are capable of being commonly supplied with an analog reference voltage via a low-pass filter from outside the semiconductor integrated circuit, wherein one capacitor is added to the capacitors of the capacitance array type D/A converter and one end of the one additional capacitor is supplied with each LSB-side successive reference voltage from the sub D/A converter, wherein the resistance string type D/A converter used as the sub D/A converter of the local D/A converter comprises a plurality of resistors connected in series, and a plurality of switches having input terminals coupled to connecting nodes of the resistors, wherein output terminals of the switches are connected in common thereby to generate the LSB-side successive reference voltages from the sub D/A converter out of the commonly-connected output terminals of the switches, and wherein one end of a series connection of the resistors of the resistance string type D/A converter used as the sub D/A converter is coupled to a second external terminal of the semiconductor integrated circuit in such a manner that the one end of the series connection thereof is capable of being supplied with the analog reference voltage from outside the semiconductor integrated circuit.

2. The semiconductor integrated circuit according to claim 1, wherein the analog reference voltage is supplied to the first external terminal of the semiconductor integrated circuit via the low-pass filter from outside the semiconductor integrated circuit, and the analog reference voltage is supplied to the second external terminal of the semiconductor integrated circuit from outside the semiconductor integrated circuit.

3. A semiconductor integrated circuit comprising:

a successive approximation type A/D converter incorporated therein, including a local D/A converter, wherein a main D/A converter and a sub D/A converter of the local D/A converter are respectively constituted of a capacitance array type D/A converter and a resistance string type D/A converter, wherein the capacitance array type D/A converter used as the main D/A converter is constituted of a plurality of capacitors and a plurality of changeover switches respectively coupled to one ends of the capacitors, and the other ends of the capacitors are commonly coupled to a voltage comparator inputted with each voltage for common connection as a successive reference voltage compared with an input analog signal, wherein one input terminals of the changeover switches are commonly coupled to a first external terminal of the semiconductor integrated circuit in such a manner that the one input terminals of the respective changeover switches are capable of being commonly supplied with an analog reference voltage via a low-pass filter from outside the semiconductor integrated circuit, and the capacitance array type D/A converter includes one capacitor added to the capacitors and having one end supplied with each LSB-side successive reference voltage from the sub D/A converter, wherein the resistance string type D/A converter used as the sub D/A converter of the local D/A converter comprises a plurality of resistors connected in series, and a plurality of switches having input terminals coupled to connecting nodes of the resistors, and wherein output terminals of the switches are connected in common thereby to generate the LSB-side successive reference voltages from the sub D/A converter out of the commonly-connected output terminals of the switches, and a connecting destination for one end of a series connection of the resistors of the resistance string type D/A converter used as the sub D/A converter is switched from the first external terminal to a second external terminal of the semiconductor integrated circuit in such a manner that the one end of the series connection thereof is capable of being supplied with the analog reference voltage from outside the semiconductor integrated circuit.

4. The semiconductor integrated circuit according to claim 3, wherein the analog reference voltage is supplied to the first external terminal of the semiconductor integrated circuit via the low-pass filter from outside the semiconductor integrated circuit, and the analog reference voltage is supplied to the second external terminal of the semiconductor integrated circuit from outside the semiconductor integrated circuit.

5. The semiconductor integrated circuit according to claim 3, wherein the one end of the series connection of the resistors of the resistance string type D/A converter used as the sub D/A converter is coupled to the first external terminal of the semiconductor integrated circuit via a drain-source current path of a first P channel MOS transistor, the one end of the series connection of the resistors of the resistance string type D/A converter used as the sub D/A converter is coupled to the second external terminal of the semiconductor integrated circuit via a drain-source current path of a second P channel MOS transistor, and the first P channel MOS transistor is controlled to an off state and the second P channel MOS transistor is controlled to an on state to thereby switch the connecting destination for the one end of the series connection of the resistors from the first external terminal to the second external terminal.

6. The semiconductor integrated circuit according to claim 4, wherein the one end of the series connection of the resistors of the resistance string type D/A converter used as the sub D/A converter is coupled to the first external terminal of the semiconductor integrated circuit via a drain-source current path of a first P channel MOS transistor, the one end of the series connection of the resistors of the resistance string type D/A converter used as the sub D/A converter is coupled to the second external terminal of the semiconductor integrated circuit via a drain-source current path of a second P channel MOS transistor, and the first P channel MOS transistor is controlled to an off state and the second P channel MOS transistor is controlled to an on state to thereby switch the connecting destination for the one end of the series connection of the resistors from the first external terminal to the second external terminal.

7. The semiconductor integrated circuit according to claim 5, wherein control programs for controlling the first P channel MOS transistor to an off state and controlling the second P channel MOS transistor to an on state are stored in a built-in memory.

8. The semiconductor integrated circuit according to claim 6, wherein control programs for controlling the first P channel MOS transistor to an off state and controlling the second P channel MOS transistor to an on state are stored in a built-in memory.

9. The semiconductor integrated circuit according to claim 7, wherein the built-in memory is a nonvolatile memory.

10. The semiconductor integrated circuit according to claim 9, wherein the nonvolatile memory is a read-only memory or a flash nonvolatile memory.

11. A semiconductor integrated circuit comprising:

a successive approximation type A/D converter built therein, including a local D/A converter, wherein a main D/A converter and a sub D/A converter of the local D/A converter are respectively constituted of a capacitance array type D/A converter and a current switching type D/A converter, wherein the capacitance array type D/A converter used as the main D/A converter is constituted of a plurality of capacitors and a plurality of changeover switches respectively coupled to one ends of the capacitors, and the other ends of the capacitors are commonly coupled to a voltage comparator inputted with each voltage for common connection as a successive reference voltage compared with an input analog signal, wherein one input terminals of the changeover switches are commonly coupled to a first external terminal of the semiconductor integrated circuit in such a manner that the one input terminals of the respective changeover switches are capable of being commonly supplied with an analog reference voltage via a low-pass filter from outside the semiconductor integrated circuit, wherein one capacitor is added to the capacitors of the capacitance array type D/A converter and one end of the one additional capacitor is supplied with each LSB-side successive reference voltage from the sub D/A converter, wherein the current switching type D/A converter used as the sub D/A converter of the local D/A converter comprises a plurality of constant current sources weighted at a predetermined ratio, and a plurality of differential pair transistors respectively coupled to the constant current sources, wherein output terminals of the one transistors of the differential pair transistors are connected in common thereby to generate the LSB-side successive reference voltages from the sub D/A converter out of the commonly-connected output terminals of the one transistors, and wherein the constant current sources of the current switching type D/A converter used as the sub D/A converter are coupled to a second external terminal of the semiconductor integrated circuit in such a manner that the constant current sources of the current switching type D/A converter used as the sub D/A converter are capable of being supplied with the analog reference voltage from outside the semiconductor integrated circuit.

12. The semiconductor integrated circuit according to claim 11, wherein the analog reference voltage is supplied to the first external terminal of the semiconductor integrated circuit via the low-pass filter from outside the semiconductor integrated circuit, and the analog reference voltage is supplied to the second external terminal of the semiconductor integrated circuit from outside the semiconductor integrated circuit.

13. A semiconductor integrated circuit comprising:
a successive approximation type A/D converter built therein, including a local D/A converter,
wherein a main D/A converter and a sub D/A converter of the local D/A converter are respectively constituted of a capacitance array type D/A converter and a current switching type D/A converter,
wherein the capacitance array type D/A converter used as the main D/A converter is constituted of a plurality of capacitors and a plurality of changeover switches respectively coupled to one ends of the capacitors, and the other ends of the capacitors are commonly coupled to a voltage comparator inputted with each voltage for common connection as a successive reference voltage compared with an input analog signal,
wherein one input terminals of the changeover switches are commonly coupled to a first external terminal of the semiconductor integrated circuit in such a manner that the one input terminals of the respective changeover switches are capable of being commonly supplied with an analog reference voltage via a low-pass filter from outside the semiconductor integrated circuit,
wherein in the capacitance array type D/A converter, one capacitor is added to the capacitors and one end of the one additional capacitor is supplied with each LSB-side successive reference voltage from the sub D/A converter,
wherein the current switching type D/A converter used as the sub D/A converter of the local D/A converter comprises a plurality of constant current sources weighted at a predetermined ratio, and a plurality of differential pair transistors respectively coupled to the constant current sources,
wherein output terminals of the one transistors of the differential pair transistors are connected in common thereby to generate the LSB-side successive reference voltages from the sub D/A converter out of the commonly-connected output terminals of the one transistors, and
wherein connecting destinations for the constant current sources of the current switching type D/A converter used as the sub D/A converter are switchable from the first external terminal to a second external terminal of the semiconductor integrated circuit in such a manner that the constant current sources of the current switching type D/A converter used as the sub D/A converter are capable of being supplied with the analog reference voltage from outside the semiconductor integrated circuit.

14. The semiconductor integrated circuit according to claim 13, wherein the analog reference voltage is supplied to the first external terminal of the semiconductor integrated circuit via the low-pass filter from outside the semiconductor integrated circuit, and the analog reference voltage is supplied to the second external terminal of the semiconductor integrated circuit from outside the semiconductor integrated circuit.

15. The semiconductor integrated circuit according to claim 13, wherein the constant current sources of the current switching type D/A converter configured as the sub D/A converter are coupled to the first external terminal of the semiconductor integrated circuit via a drain-source current path of a first P channel MOS transistor, the constant current sources of the current switching type D/A converter configured as the sub D/A converter are coupled to the second external terminal of the semiconductor integrated circuit via a drain-source current path of a second P channel MOS transistor, and the first P channel MOS transistor is controlled to an off state and the second P channel MOS transistor is controlled to an on state to thereby switch the connecting destination of the constant current sources from the first external terminal to the second external terminal.

16. The semiconductor integrated circuit according to claim 14, wherein the constant current sources of the current switching type D/A converter configured as the sub D/A converter are coupled to the first external terminal of the semiconductor integrated circuit via a drain-source current path of a first P channel MOS transistor, the constant current sources of the current switching type D/A converter configured as the sub D/A converter are coupled to the second external terminal of the semiconductor integrated circuit via a drain-source current path of a second P channel MOS transistor, and the first P channel MOS transistor is controlled to an off state and the second P channel MOS transistor is controlled to an on state to thereby switch the connecting destination of the constant current sources from the first external terminal to the second external terminal.

17. The semiconductor integrated circuit according to claim 15, wherein control programs for controlling the first P channel MOS transistor to an off state and controlling the second P channel MOS transistor to an on state are stored in a built-in memory.

18. The semiconductor integrated circuit according to claim 16, wherein control programs for controlling the first P channel MOS transistor to an off state and controlling the second P channel MOS transistor to an on state are stored in a built-in memory.

19. The semiconductor integrated circuit according to claim 17, wherein the built-in memory is a nonvolatile memory.

20. The semiconductor integrated circuit according to claim 8, wherein the built-in memory is a nonvolatile memory.

21. The semiconductor integrated circuit according to claim 20, wherein the nonvolatile memory is a read-only memory or a flash nonvolatile memory.

22. The semiconductor integrated circuit according to claim 18, wherein the built-in memory is a nonvolatile memory.

* * * * *